United States Patent
Tamba et al.

(10) Patent No.: US 7,928,587 B2
(45) Date of Patent: Apr. 19, 2011

(54) POWER SEMICONDUCTOR MODULE

(75) Inventors: Akihiro Tamba, Hitachinaka (JP); Kazuhiro Suzuki, Mito (JP); Koji Sasaki, Mito (JP); Shinji Hiramitsu, Kashiwa (JP); Hirokazu Inoue, Tokai (JP)

(73) Assignee: Hitachi, Ltd., Tokyo (JP)

( * ) Notice: Subject to any disclaimer, the term of this patent is extended or adjusted under 35 U.S.C. 154(b) by 266 days.

(21) Appl. No.: 12/105,553

(22) Filed: Apr. 18, 2008

(65) Prior Publication Data
US 2008/0258316 A1 Oct. 23, 2008

(30) Foreign Application Priority Data
Apr. 19, 2007 (JP) ................................. 2007-110196

(51) Int. Cl.
*H01L 33/00* (2010.01)
*H01L 23/48* (2006.01)
*H01L 23/52* (2006.01)
*H01L 23/28* (2006.01)
*H01L 23/29* (2006.01)
(52) U.S. Cl. ......... 257/784; 257/787; 257/788; 257/100
(58) Field of Classification Search ................... 257/784, 257/341, 780, 737, 738, 207, 287, 401, 500, 257/502, 578, 691, 690, 787, 788, 789, 790, 257/795, 100
See application file for complete search history.

(56) References Cited

U.S. PATENT DOCUMENTS

| | | | |
|---|---|---|---|
| 5,785,799 | A | 7/1998 | Culnane et al. |
| 6,165,820 | A * | 12/2000 | Pace .............................. 438/125 |
| 6,353,258 | B1 * | 3/2002 | Inoue et al. .................... 257/723 |
| 7,105,932 | B2 | 9/2006 | Kodani et al. |
| 2003/0052400 | A1 | 3/2003 | Okura et al. |
| 2004/0248330 | A1 | 12/2004 | Kitabatake et al. |
| 2006/0226433 | A1 | 10/2006 | Kawano |
| 2007/0141755 | A1 * | 6/2007 | Luechinger .................. 438/123 |
| 2007/0290305 | A1 * | 12/2007 | Oyama et al. ................. 257/678 |
| 2009/0039484 | A1 * | 2/2009 | Mahler et al. ................. 257/676 |

FOREIGN PATENT DOCUMENTS
JP 2006-179538 7/2006

OTHER PUBLICATIONS

Office Action in German Patent Appln. 10 2008 019 407.7-33 (with English language translation), dated Nov. 23, 2009.

* cited by examiner

*Primary Examiner* — Chuong A. Luu
(74) *Attorney, Agent, or Firm* — Antonelli, Terry, Stout & Kraus, LLP.

(57) ABSTRACT

A power semiconductor module having a surface of the power semiconductor chip and an external circuit pattern connected by an aluminum wire, and sealed with an epoxy resin, wherein wire diameter of the aluminum wire is 0.4±0.05 mmφ, and coefficient of linear expansion of the epoxy resin in a rated temperature range of a module is from 15 to 20 ppm/K.

21 Claims, 8 Drawing Sheets 1505 3 WIRES  1504 4 WIRES  1503 2 WIRES 1605  1604  1603

POWER SEMICONDUCTOR MODULE

BACKGROUND OF THE INVENTION

The present invention relates to a wiring structure and a resin sealing structure in a power semiconductor module, in particular, to a wiring structure and a resin sealing structure in a power semiconductor module, where high reliability and longer-life under severe use environment are required, like an IGBT (Insulated Gate Bipolar Transistor) module for automobile use typified by hybrid vehicle applications.

In a power semiconductor module such as an IGBT module for controlling an electric current of several amperes to several-hundred amperes, still more about one thousand amperes, it is general that an electrode at the surface of a power semiconductor chip, and an external circuit pattern are connected with an aluminum wire. This aluminum wire is bonded to an aluminum electrode at the surface of the power semiconductor chip by ultrasonic bonding. This is because of providing relatively small damage to the element in the bonding step, and also low cost of both the metalizing step and the wire bonding step, and still more relatively high bonding reliability also.

In a general power semiconductor module having such a wire connecting structure, connecting life-time of an adhered solder layer of a ceramics substrate, and connecting life-time of an aluminum wire determine life-time of a total module. In view of this point, there have been reported that by changing a sealing resin of a power semiconductor, from silicone gel to an epoxy resin, which is a hard resin, stress dispersion and reduction of the adhered solder layer of the ceramics substrate can be attained, and longer-life of the adhered solder layer can be attained (for example, refer to "Selected Failure Mechanisms of Modern Power Modules" by Mauro Ciappa, Microelectronics Reliability 2002, 42: pp. 653-667, or JP-A-2006-179538. Accordingly, at present, a factor determining finally life-time of a power semiconductor module is mainly connecting life-time of an aluminum wire.

SUMMARY OF THE INVENTION

A power semiconductor module repeats heat generation and cooling by energization during operation. That is, a power semiconductor chip and an aluminum wire at the vicinity of a bonding part repeat stretching and shrinking movement according to each coefficient of linear expansion.

Therefore, large shear stress is generated at a bonded interface, and plastic strain is generated in an aluminum wire at the bonded interface. This strain may sometimes result in break (liftoff failure) of the aluminum wire along polycrystalline grain boundary. In addition, stress generated by mismatching between coefficient of linear expansion of the aluminum wire, and coefficient of linear expansion of a sealing epoxy resin may sometimes generate wire neck cutting of the aluminum wire.

FIG. 3 is a cross-sectional view of a power semiconductor module (an IGBT module) explaining wire break. In the same figure, the peripheral part of an IGBT chip 104 is shown by magnification. Coefficient of linear expansion of an aluminum wire 102 is about 23 ppm/K, and is generally larger than coefficient of linear expansion of an epoxy resin 101, which is a sealing material. That is, because stretching and shrinking 401 of the aluminum wire 102 is larger than stretching and shrinking 402 of the epoxy resin 101, large tensile stress is generated at the neck part 403 of the aluminum wire 102, which finally generates crack 400, leading to disconnection.

On the other hand, even in the case where the aluminum wire does not generate liftoff failure or wire neck cutting, heat generation and cooling during operation may sometimes generate crack at the bonded interface of a power semiconductor chip, leading to interface peeling. In this case, product lifetime of the power semiconductor module is determined by this peeling.

FIGS. 4 to 6 are cross-sectional views of a power semiconductor module explaining Si crack, which is one factor determining life-time of the power semiconductor module. In FIGS. 4 and 5, the peripheral part of the IGBT chip 104 is shown by magnification. As shown in FIG. 4, in the case where peeling is not generated at a sealing resin interface, only compression stress (three-axis stress) by shrinkage of a sealing epoxy resin in molding is applied on Si (the IGBT chip 104), therefore, there is no generation of Si crack. On the other hand, FIG. 5 shows an example of generation of a peeling 600 at a chip side wall part 601, FIG. 6 is one showing area 601 of FIG. 5 by magnification (deformation of the Si chip is expressed in an exaggerated state). As show in FIGS. 5 and 6, when the peeling 600 is generated once, balance of compression stress 700 in molding is lost, and tensile stress 701 is generated at the Si chip side wall 702 of the peeled part. This stress is a major cause of generation of Si chip crack 703. That is, smaller interface stress makes difficult to generate interface peeling.

The present invention was proposed in view of the above problems, and it is an object of the present invention to provide a power semiconductor module, which is capable of preventing interface peeling of the power semiconductor chip, as well as enhancing connecting life-time of an aluminum wire.

In order to solve the above problems, a power semiconductor module relevant to the present invention is a power semiconductor module having the surface of the power semiconductor chip and an external circuit pattern connected by an aluminum wire, and sealed with an epoxy resin, characterized in that wire diameter of the aluminum wire is 0.4±0.05 mmφ, and coefficient of average linear expansion of the epoxy resin in a rated temperature range of a module is from 15 to 20 ppm/K.

According to the present invention, by optimal combination of wire diameter of an aluminum wire and coefficient of average linear expansion of a sealing epoxy resin, interface peeling of the power semiconductor chip can be prevented, as well as connecting life-time of an aluminum wire can be enhanced.

In addition, in one Embodiment of the present invention, coefficient of average linear expansion of the epoxy resin in the rated temperature range of a module is 18 ppm/K±10%.

In addition, in one Embodiment of the present invention, a coating layer by a polyamide resin is provided among the epoxy resin, the power semiconductor chip and a substrate mounted with the power semiconductor chip. In this way, an epoxy resin and built-in parts can be adhered securely, and a module with higher reliability can be attained. In this Embodiment, thickness of the coating layer is preferably equal to or thinner than 10 μm.

In addition, a power semiconductor module relevant to the present invention is a power semiconductor module having the surface of the power semiconductor chip and an external circuit pattern connected by an aluminum wire, and sealed with an epoxy resin, characterized in that coefficient of linear expansion of an epoxy resin at the vicinity of the power semiconductor chip is lower than coefficient of linear expansion of an epoxy resin from the vicinity of the power semiconductor chip to the sealing surface. According to the present invention, interface peeling of the power semiconductor chip can be prevented, as well as connecting life-time of an aluminum wire can be enhanced, because separate handling is possible for break of an aluminum wire and Si crack.

In addition, in one Embodiment of the present invention, content of a filler in the epoxy resin at the vicinity of the power semiconductor chip is higher than content of a filler in the epoxy resin from the vicinity of the power semiconductor chip to the sealing surface. In this Embodiment, coefficient of linear expansion of the epoxy resin at the vicinity of the power semiconductor chip may be about ½ of coefficient of linear expansion of the epoxy resin from the vicinity of the power semiconductor chip to the sealing surface. For example, in the rated temperature range of the module, coefficient of linear expansion of the epoxy resin at the vicinity of the power semiconductor chip may be about 10 ppm/K, and average coefficient of linear expansion of the epoxy resin from the vicinity of said power semiconductor chip to the sealing surface may about 20 ppm/K.

In addition, in one Embodiment of the present invention, the epoxy resin is composed of a first epoxy resin and a second epoxy resin: the first epoxy resin seals a part from a substrate mounted with the power semiconductor chip to a height between the back side and the front side of the power semiconductor chip; and the second epoxy resin seals an part upper than the first epoxy resin. According to this Embodiment, by sealing with two kinds of epoxy resins having different coefficient of linear expansion, interface peeling of the power semiconductor chip can be prevented, as well as connecting life-time of an aluminum wire can be enhanced more effectively, because separate handling becomes possible for break of an aluminum wire and Si crack.

In addition, a power semiconductor module relevant to the present invention is a power semiconductor module having an electrode at the surface of the power semiconductor chip divided to a plurality of electrode elements, so that each of the electrode elements aligns in a direction orthogonal to a longitudinal direction thereof, characterized in that an aluminum wire connected to the electrode element nearer to the vicinity of the center of the power semiconductor chip is more enhanced in strength thereof than the strength of the other wires. According to the present invention, generation of Si crack is prevented, as well as connecting life-time of an aluminum wire is enhanced, and thus longer-life of a module can be attained.

In this Embodiment, strength of the aluminum wire may be enhanced by increasing the number of the wires and/or by enlarging wire diameter. In addition, it is desirable that wire diameter of the aluminum wire be maximum 0.5 mmφ and minimum 0.3 mmφ.

According to the present invention, it is provided a power semiconductor module, which is capable of preventing interface peeling of the power semiconductor chip, as well as enhancing connecting life-time of an aluminum wire.

Other objects, features and advantages of the invention will become apparent from the following description of the embodiments of the invention taken in conjunction with the accompanying drawings.

DESCRIPTION OF THE EMBODIMENTS

Explanation will be given in detail below on Embodiments of the present invention with reference to drawings.

Embodiment 1

Figure 1:
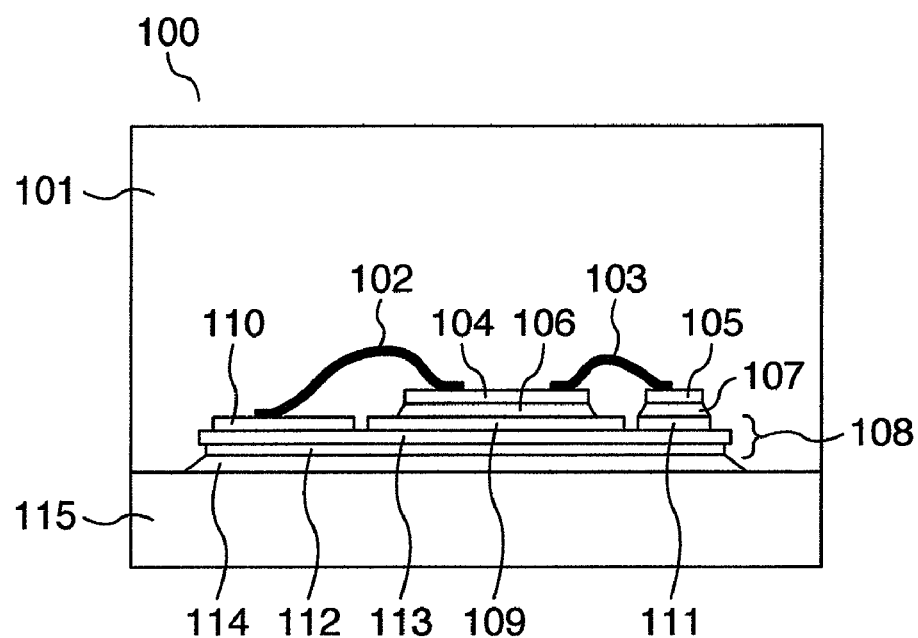
FIG. 1 is a cross-sectional view of a power semiconductor module relevant to Embodiment 1 of the present invention.

FIG. 1 is a cross-sectional view of a power semiconductor module (an IGBT module 100 having a rated voltage/electric current of 600 V/400 A) relevant to Embodiment 1 of the present invention. As shown in the same figure, the surface of the IGBT chip 104 and an emitter pattern 110 are connected by the aluminum wire 102, and the upper part than a copper base 115 is sealed with the epoxy resin 101.

According to the present Embodiment, by optimal combination of wire diameter of the aluminum wire 102, and coefficient of average linear expansion of the epoxy resin 101, life-time (power cycle life-time) of the IGBT module 100 can be enhanced. In particular, effect of attaining longer-life can be expressed significantly by making wire diameter of the aluminum wire 102 to be about 0.4 mmφ and coefficient of average linear expansion of the epoxy resin 101 in a rated temperature range of a module (here, to be set from 25 to 150° C.) to be about 18 ppm/K.

Explanation will be given below specifically on reason for obtaining effect of attaining longer-life for such power cycle life-time (connecting life-time of an aluminum wire and Si crack life-time).

Figure 3:
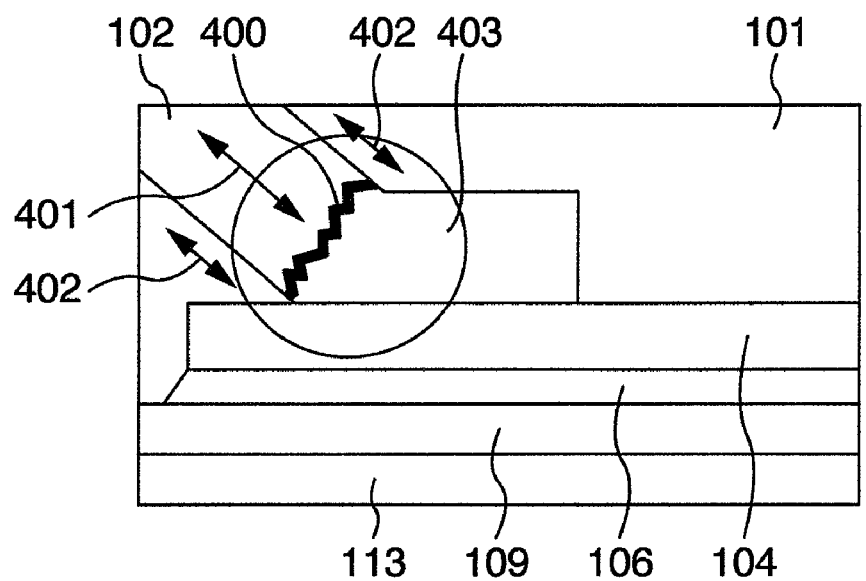
FIG. 3 is a cross-sectional view of a power semiconductor module explaining wire break.

First, cause of wire neck cutting, which determines the connecting life-time of an aluminum wire, as shown above (refer to FIG. 3) is stress generated by mismatching between coefficient of average linear expansion α of the aluminum wire 102 and coefficient of average linear expansion α of the epoxy resin 101. In order to reduce this stress, it is effective to increase cross-sectional area of the aluminum wire 102. In addition, in order to reduce mismatching of the coefficients of average linear expansion α, it is effective to make coefficient of the average linear expansion α of the epoxy resin 101 close to (that is, to make α higher) the coefficient of average linear expansion α of the aluminum wire 102. That is, in order to enhance the connecting life-time of the aluminum wire 102, it is effective to (1) increase wire diameter of the aluminum wire 102, and (2) make α of the epoxy resin 101 higher.

In addition, a major cause of the Si crack is, as shown above (refer to FIGS. 5 and 6), loss of balance of compression stress 700 in molding by side wall peeling 600 of the side wall part 601 of the chip, and accompanying tensile stress 701 generated at the side wall 702 of the IGBT chip 104. Smaller side surface stress of the IGBT chip 104 makes difficult to generate this side wall peeling 600.

Figure 6:
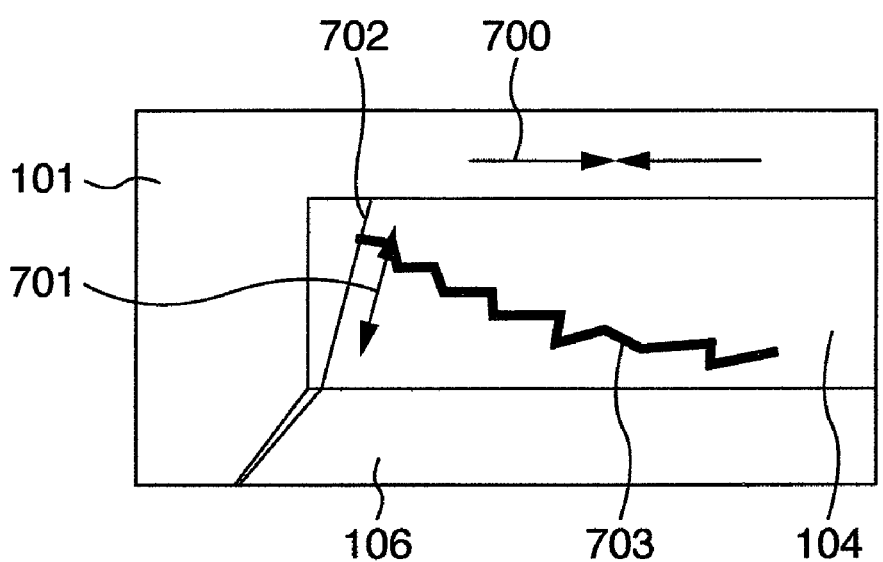
FIG. 6 is a cross-sectional view of a power semiconductor module explaining Si crack.
Figure 7:
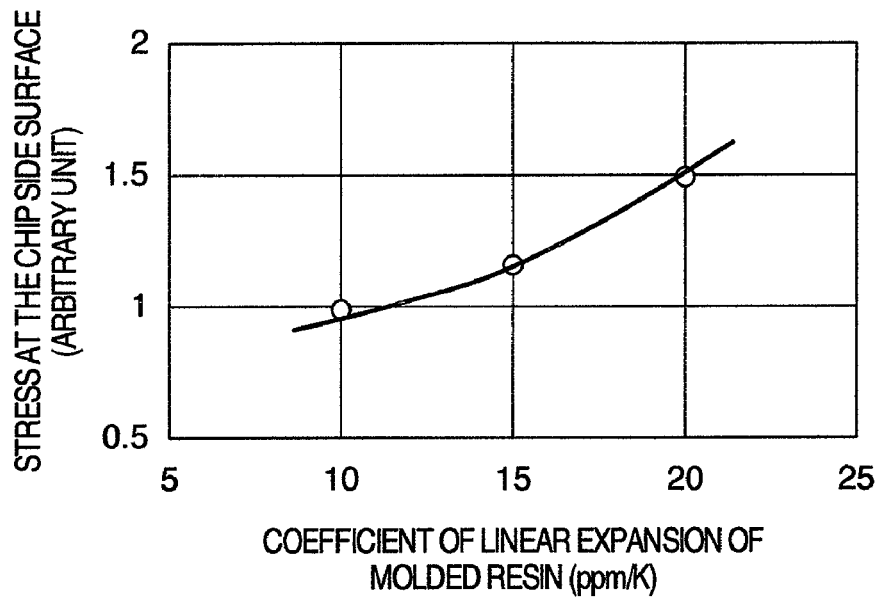
FIG. 7 is a drawing showing relation between side surface stress of an IGBT chip and coefficient of linear expansion of an epoxy resin.

FIG. 7 is numerical analysis result showing relation between side surface stress of an IGBT chip 104 and coefficient of linear expansion of an epoxy resin 101. This is analysis result by assuming execution of hard molding by a transfer molding method, and in the case where temperature is lowered from 175° C., which is general mold temperature, to 25° C. As shown in the same figure, it is understood that with decrease in coefficient of average linear expansion α of the epoxy resin 101 from 20 ppm/K to 10 ppm/K, stress at the chip side surface also decreases to about 1/1.5. This is because coefficient of average linear expansion α of the epoxy resin 101 becomes close to coefficient of average linear expansion α of the Si (about 3 ppm/K), and mismatching of the coefficients of average linear expansion α becomes small. In addition, by attaining lower α of an epoxy resin, compression stress 700 (refer to FIG. 6) is also reduced.

Figure 5:
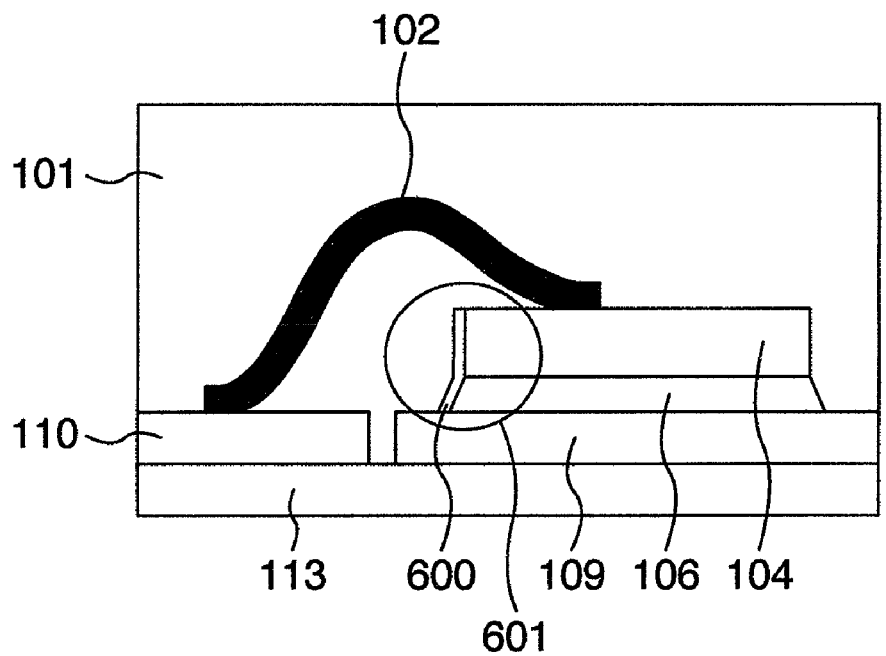
FIG. 5 is a cross-sectional view of a power semiconductor module explaining Si crack.
Figure 8:
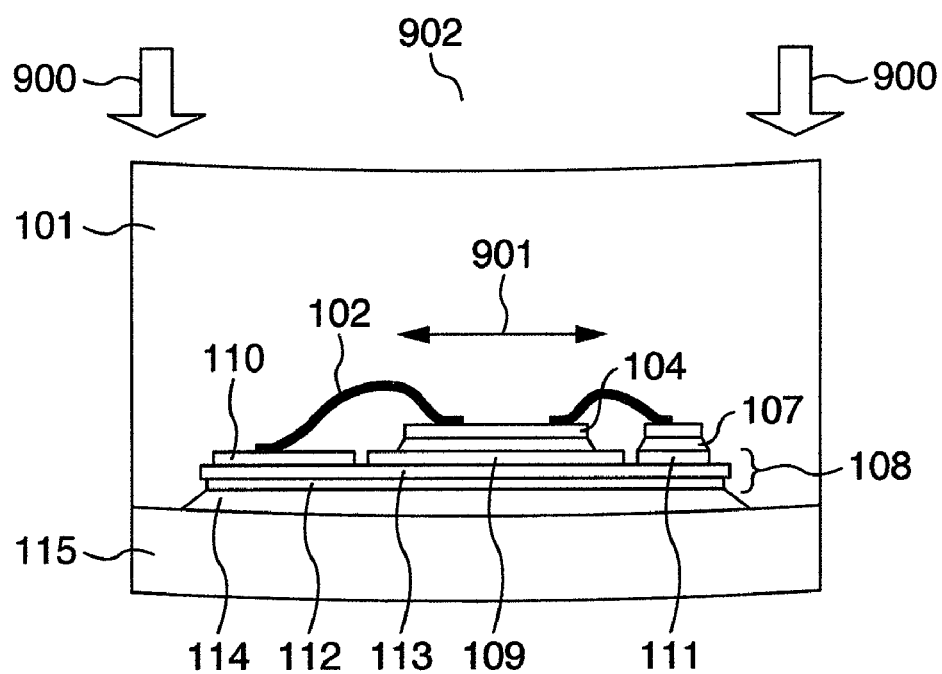
FIG. 8 is a cross-sectional view of a power semiconductor module explaining Si crack.

In addition, module warpage also gives influence on side wall peeling 600 of the IGBT chip 104 (refer to FIG. 5). FIG. 8 is a cross-sectional view of a power semiconductor module 902 explaining Si crack. As shown in the same figure, in the module 902 sealed with an epoxy resin, by chemical shrinkage and thermal shrinkage according to coefficient of average linear expansion α of the epoxy resin 101, the back side of a copper base 115 of the module deforms in convex shape. When this deformed module 902 is attached at a heat sink, the module warpage is corrected by load 900 applied in this case. As a result, a tensile stress 901 is generated at the epoxy resin 101. This tensile stress 901 promotes side wall peeling of the IGBT chip 104.

Figure 4:
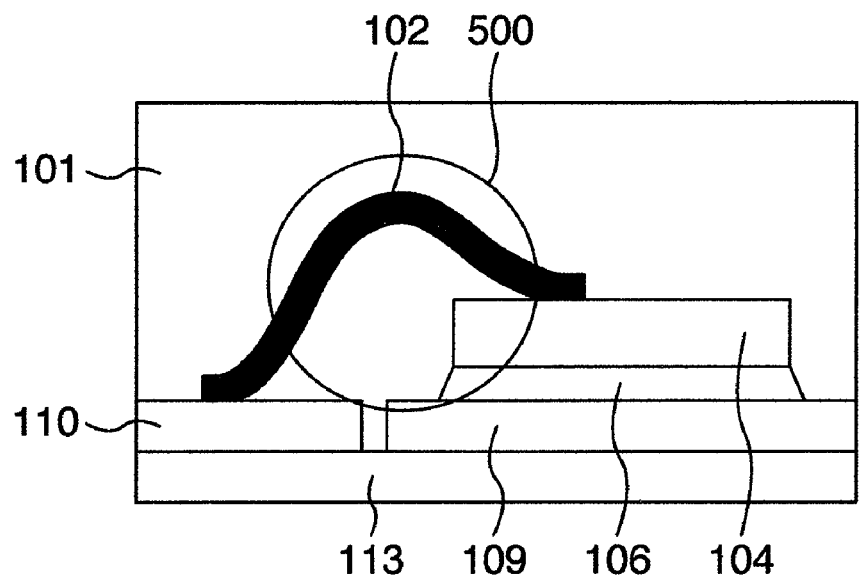
FIG. 4 is a cross-sectional view of a power semiconductor module explaining Si crack.

Still more, Si crack is also influenced by increasing wire diameter of the aluminum wire 102. Because the aluminum wire 102 has higher thermal conductivity by about two digits as compared with the epoxy resin 101, heat of the IGBT chip 104, which is a heat generation source, becomes to be easily conducted. Therefore, temperature of a region 500 in FIG. 4 becomes higher as compared with other parts, resulting in larger stress at the side surface and easy peeling at the side wall. This influence becomes significant when wire diameter of the aluminum wire 102 is increased, and generated heat of the IGBT chip 104 becomes to be conducted more. Accordingly, increasing wire diameter of the aluminum wire 102 results in to reduce Si crack resistance. In addition, increasing wire diameter of the aluminum wire 102 may sometimes increase stress of a wire bonding part, and this stress may sometimes reduce Si crack resistance.

Accordingly, in order to enhance Si crack life-time, it is effective (1) to increase wire diameter of the aluminum wire 102, and (2) to make α of the epoxy resin 101 lower are effective. In addition, with close relation to the above (2), it is also effective to reduce convex-shaped warpage of the back side of a module base.

As described above, it is understood that there is each trade-off relation between attainment of longer-life of connecting life-time of the aluminum wire, and attainment of longer-life of Si crack life-time. In particular, because of influence of wire diameter of an aluminum wire also on generation of Si crack, there is limitation in increasing wire diameter.

Explanation will be given here on a power cycle test carried out on the IGBT chip 104. An emitter electrode of the IGBT chip 104 used in the present test is divided into 12 electrode elements, and each of the electrode elements is connected, in parallel, with an aluminum wire (emitter wire) by ultrasonic bonding. In the present test, 3 kinds of aluminum wires having different wire diameter (wire diameter: 0.3 mmφ, 0.4 mmφ, 0.5 mmφ), and 2 kinds of epoxy resins having different coefficient of average linear expansion α (coefficient of average linear expansion α at 25 to 150° C.: 18 ppm/K and 21 ppm/K) were used, and for all of the combinations thereof, power cycle resistance was measured.

It should be noted that in the case where wire diameter of the aluminum wire is set to be 0.3 mmφ or 0.4 mmφ, two wires were connected by each of the emitter electrode elements; and in the case where wire diameter is set to be 0.5 mmφ, one wire was connected by each of the emitter electrode elements. Reason for setting the number of wire to be subjected to bonding to be one, in the case where wire diameter is set to be 0.5 mmφ, is that bonding of two wires was difficult in view of space, and in addition, it is difficult to maintain high yield in the bonding step in mass production.

In addition, reason for limiting a range of coefficient of average linear expansion α to be up to 150° C. is that rated temperature of the IGBT module is, in general, from 25 to 150° C., and in the case where temperature amplitude in the power cycle test is set to be 100 deg, which is generally used, maximum temperature of the chip (hot spot) becomes about 150° C. In addition, too high elastic modulus of an epoxy resin may sometimes generate Si crack in molding, and on the other hand, too low elastic modulus may sometimes impair effect of dispersion and reduction of thermal stress of the built-in parts. Therefore, it is desirable that elastic modulus of an epoxy resin is several-tens GPa. In the present test, an epoxy resin, having an elastic modulus of 15 GPa at 25° C., was used.

In the present power cycle test, by giving electrical load of energization and cutoff to the IGBT chip 104, under the above condition, and by repeatedly raising and cooling bonding temperature (junction temperature) of the IGBT chip 104, within a predetermined range (junction temperature amplitude, ΔTj), break tolerance against thermal stress of the IGBT chip 104 was evaluated. It should be noted that, in the present test, because simultaneous measurement was carried out on a plurality of modules by connecting in series, more or less variation is generated in junction temperature amplitude ΔTj, caused by variation of thermal resistance including thermal resistance of the heat sink of a test instrument, and element loss variation.

Figure 9:
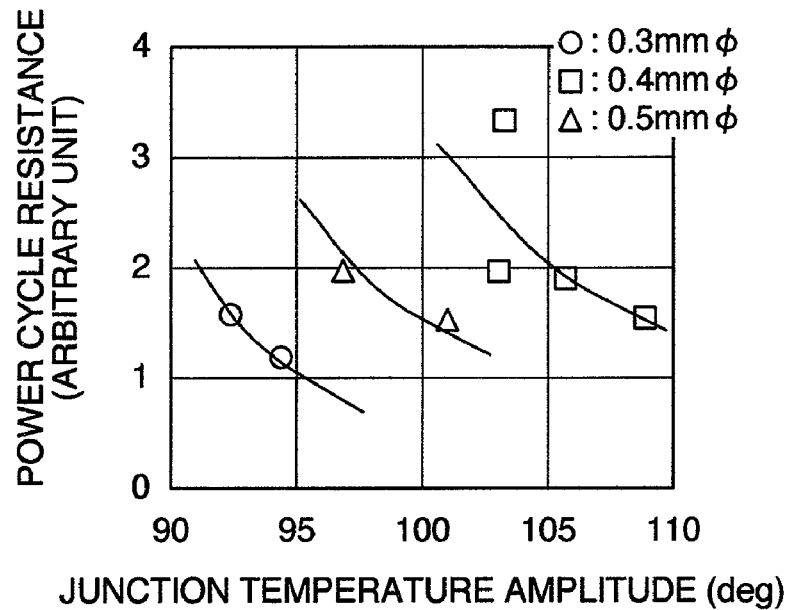
FIG. 9 is a drawing showing evaluation result of power cycle resistance.
Figure 10:
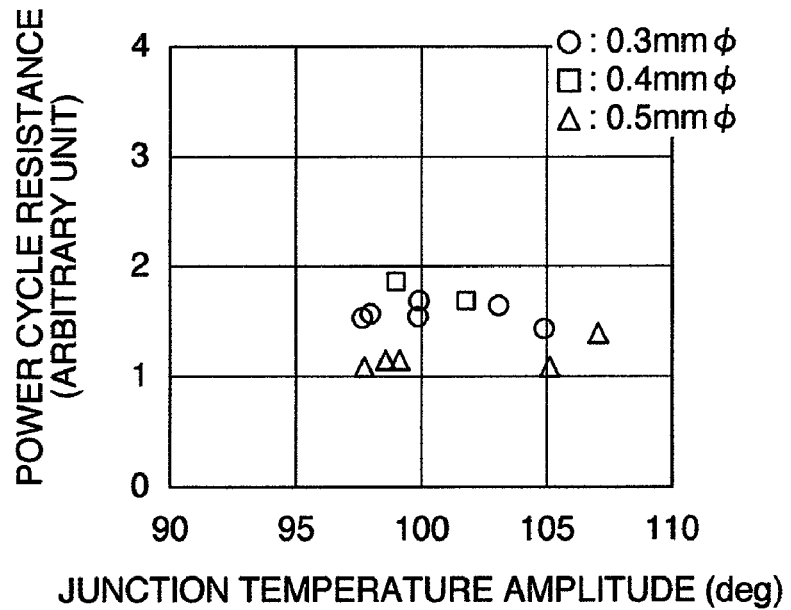
FIG. 10 is a drawing showing evaluation result of power cycle resistance.

FIGS. 9 and 10 are drawings showing evaluation result of power cycle resistance of the IGBT chip 104. In FIG. 9, power cycle resistance by each wire diameter of an aluminum wire is shown, in the case where an epoxy resin, having a coefficient of average linear expansion α of 18 ppm/K, was used. Although one having the strongest resistance to disconnection caused by wire neck break should be the wire having a wire diameter of 0.5 mmφ, which has the highest aluminum wire strength, however, as shown in the same figure, the power cycle resistance of 0.4 mmφ wire is greater than that of the 0.5 mmφ wire and 0.3 mmφ wire. In addition, it is also characteristic phenomena that in the case where wire diameter of the aluminum wire is set to be 0.3 mmφ or 0.4 mmφ, failure mode is on-voltage excess and there is no generation of withstand voltage defect, on the other hand, in the case of 0.5 mmφ, there is no excess of on-voltage, and failure mode is deterioration of main withstand voltage. That is, in the case where wire diameter of the aluminum wire is set to be 0.5 mmφ, it is understood that Si chip crack is generated easier, as compared with the case of setting to be 0.3 mmφ or 0.4 mmφ.

In FIG. 10, power cycle resistance by each wire diameter of an aluminum wire is shown, in the case where an epoxy resin having a coefficient of average linear expansion α of 21 ppm/K, was used. As shown in the same figure, one exhibiting highest power cycle resistance is the case where wire diameter of the aluminum wire is set to be 0.4 mmφ.

In addition, in comparison of FIG. 9 with FIG. 10, it is understood that power cycle resistance is higher by about 1.5 times at maximal, in the case where coefficient of average linear expansion α of an epoxy resin is set to be 18 ppm/K, as compared with the case of 21 ppm/K. This result suggests that power cycle life-time is not determined only by connecting life-time of the aluminum wire, but other factor (Si crack) also has influence. In fact, when a sample after completion of the test is opened to execute failure analysis by cross-sectional observation or the like, Si crack was observed, in the case of sealing with an epoxy resin having a coefficient of average linear expansion α of 21 ppm/K. That is, it was found that power cycle resistance is not determined by resistance of the aluminum wire, but determined by resistance of Si crack. In fact, failure mode in this case was main withstand voltage defect. On the other hand, in the case of sealing with an epoxy resin having a coefficient of average linear expansion α of 18 ppm/K, failure mode was on-voltage excess, and there is no generation of withstand voltage defect. That is, in this case, it was found that power cycle life-time is determined by resistance of wire neck cutting.

Thus, it was newly found out that wire diameter gives influence on chip crack in the power cycle test, and confirmed that optimal combination of wire diameter of an aluminum wire and coefficient of average linear expansion of a sealing epoxy resin attains longer-life of a power semiconductor module. That is, it was clarified that, by setting wire diameter of an aluminum wire to be about 0.4 mmφ, and coefficient of average linear expansion α of an epoxy resin up to a chip (module) maximal rated temperature of 150° C. to be about 18 ppm/K, longer-life of the power semiconductor module can be attained. It should be noted that in consideration of production of the power semiconductor module, it is desirable that wire diameter of the aluminum wire is 0.4±0.05 mmφ, and coefficient of average linear expansion α of the epoxy resin, at a range of a chip (module) rated temperature of from 25 to 150° C., is from 15 to 20 ppm/K (for example, 18 ppm/K±10%). In addition, in the above explanation, test results on the IGBT chip was shown, however, it is natural that similar results are obtained also on the FWD chip.

In addition, when dependency of warpage of the copper base 115 on an epoxy resin was evaluated, it was found that the warpage was about 0.16 mm, in the case where coefficient of average linear expansion α was set to be 21 ppm/K, while about 0.11 mm, in the case where coefficient of average linear expansion α was set to be 18 ppm/K. That is, it was found that, because warpage of the copper base 115 is reduced by setting the coefficient of average linear expansion α of an epoxy resin 101 to be 18 ppm/K, it is effective to prevent resin peeling.

Therefore, setting of wire diameter of the aluminum wire 102 to be about 0.4 mmφ has effect of not only reducing thermal stress of the wire itself, but also not promoting peeling of interface between the epoxy resin 101 and the side wall of the IGBT chip 104. In addition, similar effect can be obtained also by setting the coefficient of average linear expansion α of the epoxy resin 101 at from 25 to 150° C., to be about 18 ppm/K. Still more, it also has effect to reduce module warpage of a structure of copper base/ceramics substrate.

As described above, according to the IGBT module 100 relevant to the present Embodiment, by setting wire diameter of the aluminum wire 102 to be about 0.4 mmφ, and coefficient of average linear expansion α of the epoxy resin 101 to be about 18 ppm/K, power cycle life-time (thermal fatigue life-time) of a power semiconductor module sealed with an epoxy resin can be enhanced at a maximum.

Explanation will be given in detail below on configuration of the IGBT module 100 relevant to the present Embodiment.

Figure 2:
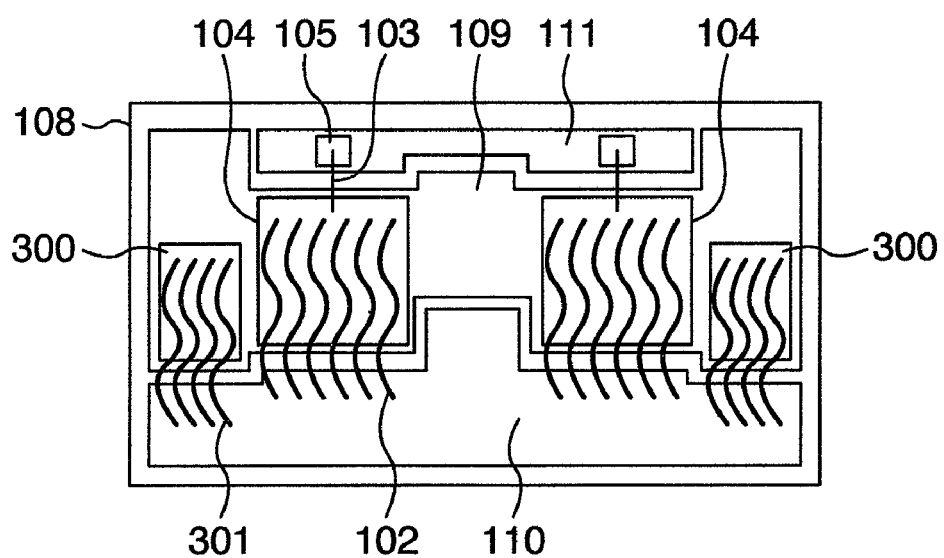
FIG. 2 shows a plan view of a ceramics substrate mounted with a power semiconductor chip.

FIG. 2 shows a plan view of a copper-clad SiN substrate 108 mounted with a power semiconductor chip. As shown in the same figure, referring to the IGBT chip 104 and the FWD chip 300 having a thickness of about 0.35 mm, two sets thereof are adhered, so as to align in parallel, to a sheet of the copper-clad SiN substrate 108 with the solder layer 106 or the like. The solder layer 106 is a high temperature lead solder with a melting point of equal to or higher than 300° C., containing about 5% of Sn and 1.5% of Ag, and thickness thereof is about 0.1 mm. It should be noted that the back side of the IGBT chip 104 is a collector electrode, and the back side of the FWD chip 300 is a cathode electrode, and in order to improve solder wettability, the surface layers thereof are metalized. In addition, rated voltage/current of the IGBT chip 104 is 600 V/200 A, respectively, and those of a free wheel diode (FWD) chip 300 are also similar.

A gate resistance chip 105 adhered with a solder layer 107 is a damping resistance for preventing resonance of the IGBT chip 104 connected in parallel, in operation.

Size of a copper-clad SiN substrate 108 is about 3 cm×5 cm. Thickness of a surface circuit pattern at the copper-clad SiN substrate 108 (collector pattern 109, emitter pattern 110, gate pattern 111) is 0.6 mm, thickness of the back side copper plate is 0.5 mm, and thickness of the SiN substrate 108 is 0.32 mm.

The copper-clad SiN substrate 108 solder adhered with the IGBT chip 104 and the FWD chip 300, is solder adhered onto the copper base 115 with a low melting point solder layer (Sn—Pb eutectic solder) 114 having a thickness of about 0.2 mm and a melting point of about 180° C. A material of the copper base 115 is oxygen-free high conductivity copper with a thickness of 3 mm.

A power semiconductor chip (the IGBT chip 104, the FWD chip 300), the copper-clad SiN substrate 108 and the copper base 115, adhered as above, are molded with the epoxy resin 101 containing fused silica as a filler, by what is called transfer molding. The epoxy resin 101 and the above built-in parts maintain high adhesion, by a structure of caulking an epoxy resin (a mold-lock structure) by installment of a protrusion (not shown) formed by two rows of grooves at the surface of the copper base 115.

The surfaces of a copper plate of the copper-clad SiN substrate 108 and the copper base 115 are subjected to nickel plating processing, in consideration of reliability (good oxidation resistance and stability of a Sn compound) of the adhesion solder layers 106, 107 and 114. Thickness of the nickel plating layer is about 6 μm. In mounting the IGBT module 100 onto an external unit, heat release may be carried out by fixing the copper base 115 to a heat sink with highly heat conductive grease or the like, or may be cooled by forming a fin at the copper base 115 to direct pouring of cooling water.

Energization to the IGBT chip 104 and the FWD chip 300 is carried out, as described above, by adhesion of the collector electrode at the back side of the IGBT chip 104 and the cathode electrode at the back side of the FWD chip 300, onto the circuit pattern (collector pattern 109 or the like) of the SiN substrate 108, as well as by connection of the emitter and anode with the aluminum wires 102 and 301, respectively. Further, the gate wire 103 is connected to the IGBT chip 104 and electricity is supplied. Theses aluminum wires contain only several tens ppm of Ni or other impurities. It should be noted that bonding number, shape and the like of the aluminum wire shown in FIG. 2 are only one example.

Embodiment 2

In general, an epoxy resin and a nickel plated layer do not have good adhesive property. Therefore, the built-in parts (in particular, the Si substrate) and an epoxy resin may sometimes peel by thermal stress in operation of the module, sometimes resulting in deterioration of various adhesion solder layers and wirings of the aluminum wire.

Accordingly, in the present Embodiment, by coating the built-in parts with a polyamide resin (coefficient of linear expansion and elastic modulus are about 50 ppm/K and 3 GPa, respectively), which is more extendable and softer than an epoxy resin, before molding, the epoxy resin and the built-in parts are adhered securely.

Figure 11:
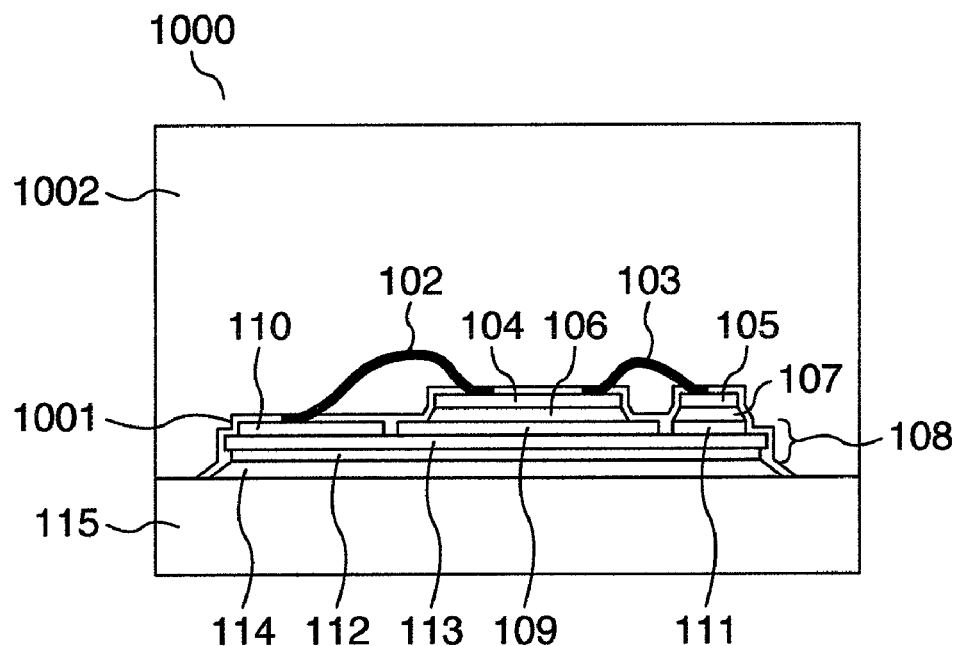
FIG. 11 is a cross-sectional view of a power semiconductor module relevant to Embodiment 2 of the present invention.

FIG. 11 is a cross-sectional view of a power semiconductor module (in IGBT module 1000) relevant to Embodiment of the present invention. As shown in the same figure, a pre-coating layer 1001 intervenes between the epoxy resin 1002 and the built-in parts. That is, the IGBT module 1000 has a structure that a part to be sealed of the IGBT module 100 shown by Embodiment 1, is still more subjected to pre-coating processing. It should be noted that to maintain the above effect of making longer-life by optimal combination of wire diameter of the aluminum wire and coefficient of average linear expansion of the epoxy resin, it is desirable that the pre-coating layer 1001 is as thinner as possible.

As one example, by execution of the power cycle test, under the same conditions as in Embodiment 1, for a module having the pre-coating layer 1001 with a layer thickness of about 10 μm, it was found that life-time was completely the same as in Embodiment 1. This shows that good adhesion of an epoxy resin can be attained, without impairing dispersion and reduction of thermal stress of the aluminum wire, even by intervening of a softer resin layer with a thickness of about 10 μm between the epoxy resin and the built-in parts.

As described above, according to the IGBT module 1000 relevant to the present Embodiment, by installment of the pre-coating layer with a polyamide resin between the epoxy resin and the built-in parts, a module with higher reliability can be attained.

Embodiment 3

By sealing a power semiconductor module with two kinds of epoxy resins having different coefficient of linear expansion, separate handling is possible for break of the aluminum wire and the Si crack, enabling to attain more stable module quality and life-time. For example, for Si crack, as described above, use of an epoxy resin having low coefficient of average linear expansion is capable of preventing peeling at the resin interface and thus making longer-life of a module.

Figure 12:
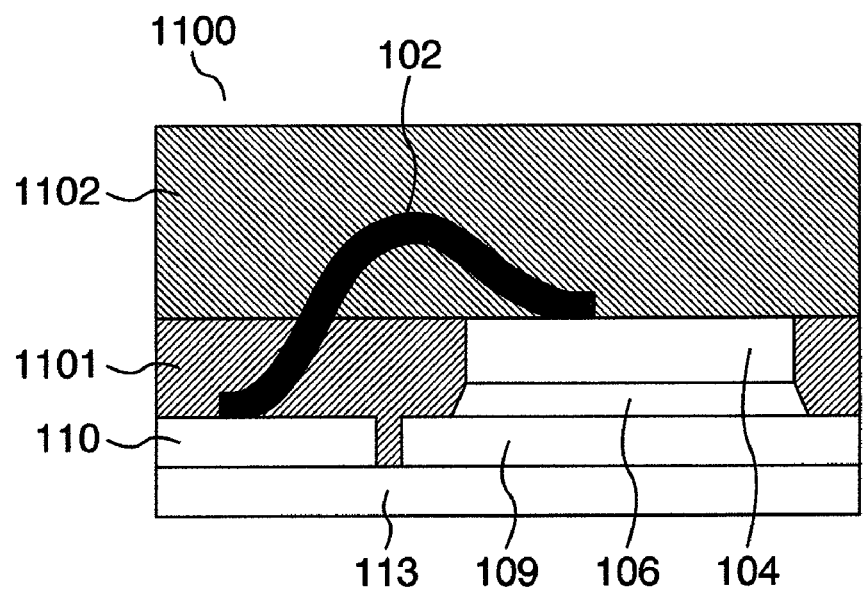
FIG. 12 is a cross-sectional view of a power semiconductor module relevant to Embodiment 3 of the present invention.

FIG. 12 is a cross-sectional view of a power semiconductor module (an IGBT module 1100) relevant to Embodiment of the present invention, and in particular, the peripheral part of the IGBT chip 104 is shown by magnification. As shown in the same figure, in the IGBT module 1100, area from the SiN substrate 113 to the surface of the IGBT chip 104 is sealed with the epoxy resin 1101 having low coefficient of average linear expansion, and area from the upper part thereof to the surface of the module is sealed with the epoxy resin 1102 having high coefficient of average linear expansion (about 2 times of the epoxy resin 1101). For example, by setting coefficient of average linear expansion α of the epoxy resin 1101 in a range of from 25 to 150° C. to be about 10 ppm/K (here, 12 ppm/K), and coefficient of average linear expansion α of the epoxy resin 1102 in a range of from 25 to 150° C. to be about 20 ppm/K (here, 20 ppm/K), connecting life-time of the aluminum wire and Si crack life-time can be enhanced to a large extent.

It should be noted that coating of the surface of the IGBT chip 104 with the epoxy resin 1101 with a thickness of about several tens μm is desirable. This is because of preventing peeling of the Si/epoxy resin interface, by sealing the whole Si with the epoxy resin 1101 having low coefficient of average linear expansion, and at the same time, preventing wire break to a maximum extent, by sealing the aluminum wire 102 with the epoxy resin 1102 having high coefficient of average linear expansion. In the case where such a sealing mode is difficult to attain, it is desirable that sealing top surface of the epoxy resin 1101 is set below the surface of the IGBT chip 104 by about 50 μm.

As described above, according to the IGBT module 1100 relevant to the present Embodiment, by sealing area from the SiN substrate 113 to the surface of the IGBT chip 104 with the epoxy resin 1101 having low coefficient of average linear expansion, and sealing area from the upper part thereof to the surface of the module with the epoxy resin 1102 having high coefficient of average linear expansion, connecting life-time of the aluminum wire and Si crack life-time can be enhanced.

In addition, because the epoxy resin 1101 sufficiently prevents generation of Si crack, wire diameter of the aluminum wire 102 results in to be set freely, without paying attention to generation of Si crack. That is, wire diameter of the aluminum wire 102 can be set to be 0.5 mmφ, which is larger than the aluminum wire in Embodiments 1 and 2. In this way, making α of the above epoxy resin 1102 higher, as well as making a module still more longer-life can be attained. In fact, by execution of the power cycle test under the same conditions as in Embodiments 1 and 2, it was confirmed longer-life by further about 20%, as compared with Embodiments 1 and 2.

It should be noted that, in the present Embodiment, because a transfer molding method cannot be applied to resin sealing, a so-called potting method is adopted, wherein, by adhering a plastic case made of polyphenylene sulfide (PPS) in advance around the copper base, a resin is dropped and charged therein. In addition, as for the epoxy resins 1101 and 1102, an epoxy resin, having an elastic modulus of equal to or lower than 20 GPa, is adopted. This is because, use of a resin having an elastic modulus of far over 20 GPa could generate Si crack by sealing.

Embodiment 4

Figure 13:
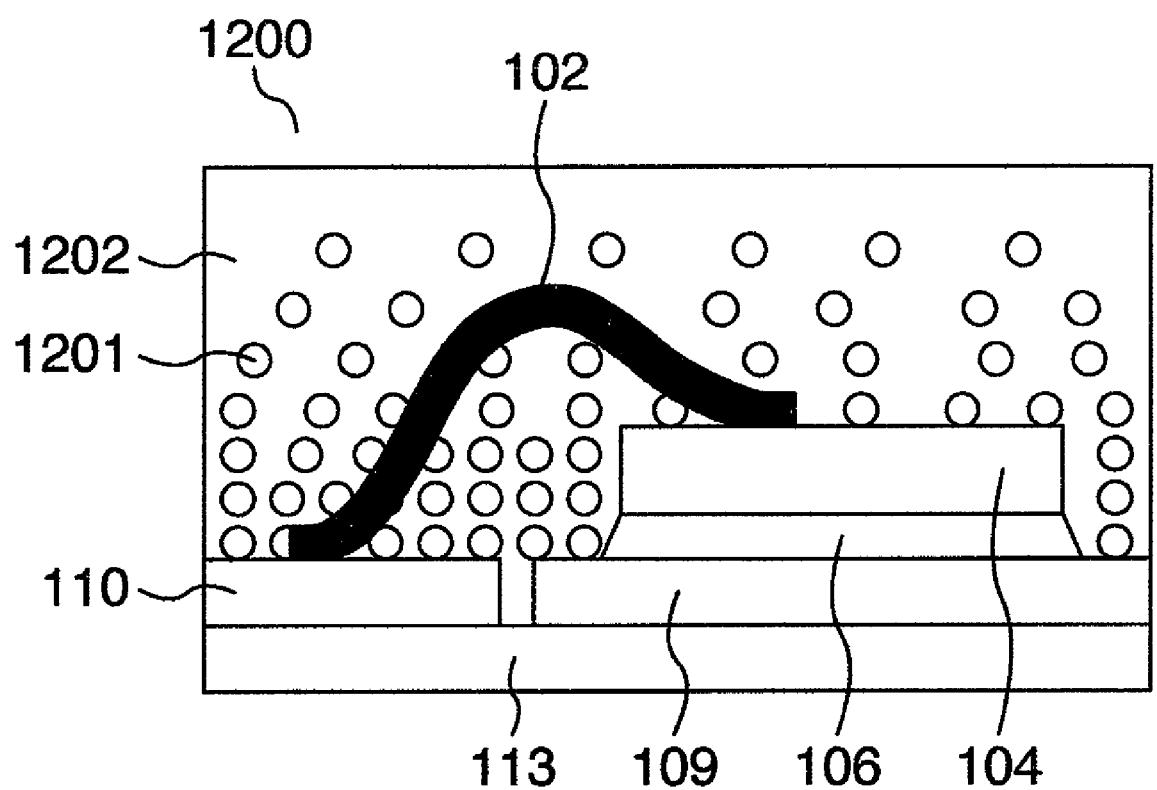
FIG. 13 is a cross-sectional view of a power semiconductor module relevant to Embodiment 4 of the present invention.

FIG. 13 is a cross-sectional view of a power semiconductor module (an IGBT module 1200) relevant to Embodiment of the present invention, and in particular, the peripheral part of the IGBT chip 104 is shown by magnification. As shown in the same figure, the epoxy resin 1202 contains a silica filler 1201. The filler 1201 is one for adjusting coefficient of average linear expansion α and elastic modulus of the epoxy resin 1202.

According to the present Embodiment, by reducing content of the filler 1201 from the lower surface of the seal toward the upper direction, coefficient of average linear expansion α of the epoxy resin is increased to be able to attain the same effect as in Embodiment 3.

It should be noted that, increase in content of the filler 1201 also increases thermal conductivity of the epoxy resin 1202. In particular, by using ceramics such as alumina, AlN, BN for the filler material, this effect is expressed significantly. On the other hand, in the case of using fused silica for the filler material, this enhancing effect of thermal conductivity is not observed so much.

Embodiment 5

In general, an emitter electrode of an IGBT chip is divided to plurality of electrode elements, and these electrode elements align in a direction orthogonal to a longitudinal direction of each of the electrode elements. In addition, an IGBT chip has temperature distribution so as to become higher at the center of the chip and lower at the peripheral part of the chip in heat generation. This is because, the chip center is a main part of a heat generator, on the other hand the peripheral part of the chip is a non-heat generating region, where main current does not flow, which is called an applied collector voltage relaxation layer (FLR). In fact, by measurement of temperature distribution of the IGBT chip, it is found that temperature of the electrode element at the vicinity of a gate electrode at the chip center is 150° C. (maximum), and temperature of the chip peripheral part is 100° C., thus there is a temperature difference of as large as 50 degree between them. In the case where such a large temperature difference is present, deterioration of the aluminum wire is initiated from the chip center part, and the deterioration gradually proceeds toward the peripheral part.

However, increase in the number or wire diameter for all of the wires to be connected to the electrode elements, for reinforcement thereof, results in easy generation of Si crack, as described above. In addition, because ultrasonic bonding of the aluminum wire is the process step giving damage to the chip, it lowers assembling yield in the production step of a product.

Accordingly, in the present Embodiment, by reinforcing the aluminum wire to be connected to the electrode element at the vicinity of the chip center in a direction orthogonal to a longitudinal direction of the electrode element, generation of Si crack is prevented, as well as connecting life-time of the aluminum wire is enhanced and longer-life of the module is attained.

Figure 14:
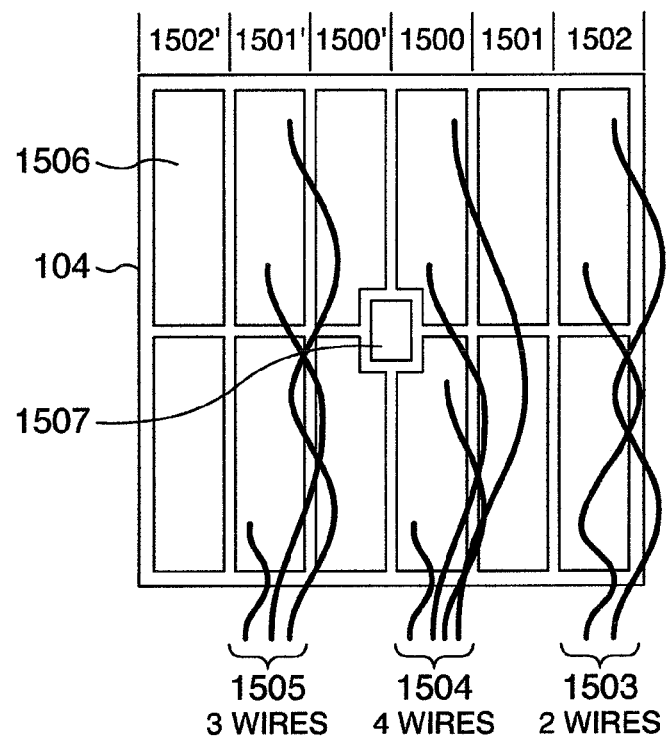
FIG. 14 is a cross-sectional view of a power semiconductor module relevant to Embodiment 5 of the present invention.

FIG. 14 is a plan view of a power semiconductor module (the IGBT chip 104) relevant to Embodiment of the present invention. As shown in the same figure, in the IGBT chip 104 relevant to the present Embodiment, the emitter electrode is divided to the 12 electrode elements 1506. In addition, the number of the aluminum wires 1503, 1504, 1505 to be connected to the electrode elements 1506 at the vicinity of the chip center (here, areas 1500 and 1500') in a direction orthogonal to a longitudinal direction of the electrode elements 1506, is set more, and the number of the wires to be connected to the electrode elements 1506 at the vicinity of the chip peripheral part (here, areas 1502 and 1502') is set less.

Here, the aluminum wires having a wire diameter of 0.4 mmϕ are connected so that the number of wires becomes symmetric the chip center part in a direction orthogonal to a longitudinal direction of the electrode elements 1506, as the center. For example, the same number of wires is connected respectively to the electrode elements 1506 at the areas 1500 and 1500', and to the electrode elements 1506 at the areas 1502 and 1502'. In addition, a so-called stitch bonding is partially adopted, where one aluminum wire connects two electrode elements. Specifically, as shown in FIG. 14, there are connected each two aluminum wires to the electrode elements 1506 at the area 1500, each one aluminum wire and one stitch wire to the electrode elements 1506 at the area 1501, and two stitch wires to the electrode elements 1506 at the area 1502.

In fact, when a module wired by the above aluminum wire specification was molded with an epoxy resin having coefficient of average linear expansion α of 18 ppm/K at 25 to 150° C., the same as in Embodiment 1, and subjected to the power cycle test under the same condition as in Embodiment 1, nearly the same resistance was obtained. That is, it is confirmed that longer-life of the module can be attained, even the number of the aluminum wires for the IGBT chip in total is reduced.

As described above, according to the IGBT chip 104 relevant to the present Embodiment, by setting more number of the aluminum wires to be connected to the electrode elements 1506 at the vicinity of the chip center in a direction orthogonal to a longitudinal direction of the electrode elements 1506, and by setting less number of the wires to be connected to the electrode elements 1506 at the chip peripheral part, generation of Si crack can be suppressed, as well as connecting life-time of the aluminum wire can be enhanced. In addition, because the number of the aluminum wires to be connected to the emitter electrode can be decreased, production cost of a product can be reduced, as well as higher production yield than in Embodiment 1 can be attained.

Embodiment 6

The object and effect of the present Embodiment are the same as those of Embodiment 5.

Figure 15:
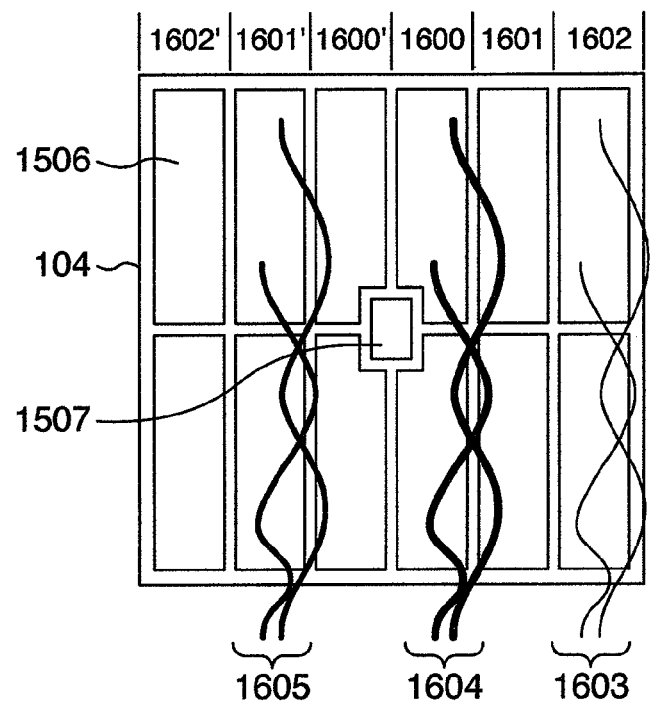
FIG. 15 is a cross-sectional view of a power semiconductor module relevant to Embodiment 6 of the present invention.

FIG. 15 is a plan view of a power semiconductor module (the IGBT chip 104) relevant to Embodiment of the present invention. As shown in the same figure, in the IGBT chip 104 relevant to the present Embodiment, by changing wire diameter of the aluminum wires 1603, 1604, 1605, the aluminum wire at the vicinity of the center of the IGBT chip 104 in a direction orthogonal to a longitudinal direction of the electrode elements 1506, is reinforced. Specifically, there are connected each, a wire having a wire diameter of 0.5 mmϕ to the electrode elements 1506 at the area 1600, a wire having a wire diameter of 0.4 mmϕ to the electrode elements 1506 at the area 1601, and a wire having a wire diameter of 0.3 mmϕ to the electrode elements 1506 at the area 1602.

Here, the same number of aluminum wires is connected, so that wire diameter becomes symmetric around the chip center part in a direction orthogonal to a longitudinal direction of the electrode elements 1506, as the center. For example, wires with the same wire diameter are connected each to the electrode elements 1506 at the areas 1600 and 1600', and to the electrode elements 1506 at the areas 1602 and 1602'. In addition, all of the aluminum wires are stitch bonding and, as shown in the same figure, two electrode elements 1506 are connected with two stitch wires.

If temperature amplitude applied to all of the aluminum wires is the same, thermal stress to be generated in a wire having a wire diameter of 0.3 mmϕ will become far larger as compared with thermal stress to be generated in a wire having a wire diameter of 0.5 mmϕ, however, as described above, because temperature amplitude of the electrode elements 1506 at the chip peripheral part is significantly smaller compared with that at the vicinity of the chip center, influence on wire life-time is small, even when wire diameter is reduced. In fact, when the power cycle test was carried out under all the same condition as in Embodiment 5, except the aluminum wires, life-time little decreased as compared with Embodiment 5.

As described above, according to the IGBT chip 104 relevant to the present Embodiment, because of setting larger wire diameter of the aluminum wires to be connected to the electrode elements 1506 at the vicinity of the chip center in a direction orthogonal to a longitudinal direction of the electrode element, and of setting smaller wire diameter of the wires to be connected to the electrode element at the chip peripheral part, life-time of the module can be enhanced.

According to a power semiconductor module explained above, interface peeling of a semiconductor chip can be prevented, as well as connecting life-time of the aluminum wire can be enhanced.

It should be noted that the present invention should not be limited to the above 6 Embodiments, and various modified execution are possible. And, any of these various Embodiments may be combined with any of these.

In addition, to a power semiconductor module relevant to the present Embodiment, without limiting to the IGBT chip, the FWD chip or a power MOSFET can be applied. In addition, a copper wire may be used instead of the above aluminum wire. In addition, a range of rated temperature of a module may be a range different from 25 to 150° C.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power semiconductor module comprising:
a SiN substrate;
a power semiconductor chip mounted on a major surface of said SiN substrate with a solder; and
an aluminum wire connected between a surface of said power semiconductor chip and a first circuit pattern, wherein:
said major surface of said SiN substrate, said power semiconductor chip, said aluminum wire and said first circuit pattern are sealed with an epoxy resin, and
a wire diameter of said aluminum wire is 0.4±0.05 mmϕ, and coefficient of linear expansion of said epoxy resin in a rated temperature range of said module is from 15 to 20 ppm/K, and
a coefficient of linear expansion of an epoxy resin at the vicinity of said power semiconductor chip is lower than a coefficient of linear expansion of an epoxy resin from the vicinity of said power semiconductor chip to the sealing surface.

2. The power semiconductor module according to claim 1, wherein
the coefficient of linear expansion of said epoxy resin in the rated temperature range of a module is 18 ppm/K±10%.

3. The power semiconductor module according to claim 1, wherein
a coating comprised of a polyamide resin is provided among said epoxy resin, said power semiconductor chip and a substrate mounted with said power semiconductor chip.

4. The power semiconductor module according to claim 3, wherein
a thickness of said coating layer is equal to or thinner than 10 μm.

5. A power semiconductor module having the surface of the power semiconductor chip and an external circuit pattern connected by an aluminum wire, and sealed with an epoxy resin, wherein
a coefficient of linear expansion of an epoxy resin at the vicinity of said power semiconductor chip is lower than a coefficient of linear expansion of an epoxy resin from the vicinity of said power semiconductor chip to the sealing surface.

6. The power semiconductor module according to claim 5, wherein
content of a filler in the epoxy resin at the vicinity of said power semiconductor chip is higher than content of a filler in the epoxy resin from the vicinity of said power semiconductor chip to the sealing surface.

7. The power semiconductor module according to claim 5, wherein
the coefficient of linear expansion of the epoxy resin at the vicinity of said power semiconductor chip is about ½ of coefficient of linear expansion of the epoxy resin from the vicinity of said power semiconductor chip to the sealing surface.

8. The power semiconductor module according to claim 7, wherein
in the rated temperature range of the module, average coefficient of linear expansion of the epoxy resin at the vicinity of aforesaid power semiconductor chip is about 10 ppm/K, and average coefficient of linear expansion of the epoxy resin from the vicinity of said power semiconductor chip to the sealing surface is about 20 ppm/K.

9. The power semiconductor module according to claim 5, wherein
said epoxy resin is composed of a first epoxy resin and a second epoxy resin:
said first epoxy resin seals a part from a substrate mounted with said power semiconductor chip to a height between a back side and a front side of said power semiconductor chip; and
said second epoxy resin seals an part upper than said first epoxy resin.

10. The power semiconductor module according to claim 1, wherein said rated temperature range is from 25°-150° C.

11. The power semiconductor module according to claim 1, wherein the first circuit pattern is located on said major surface of said SiN substrate adjacent said chip.

12. The power semiconductor module according to claim 11, wherein a second circuit pattern is located on said major surface of said SiN substrate under said chip such that said second circuit pattern is interposed between said major surface of said SiN substrate and a lower surface of said chip, and wherein said solder is located between said lower surface of said chip and said second circuit pattern to connect the chip to said second circuit pattern.

13. The power semiconductor module according to claim 12, wherein said rated temperature range is from 25°-150° C.

14. A power semiconductor module comprising:
a SiN substrate;
a power semiconductor chip mounted on a major surface of said SiN substrate with a solder; and
an aluminum wire connected between a surface of said power semiconductor chip and a first circuit pattern, wherein
said major surface of said SiN substrate, said power semiconductor chip, said aluminum wire and said first circuit pattern are sealed with an epoxy resin,
means for preventing interface peeling of said chip and disconnection of said aluminum wire from said chip caused by stresses generated between said aluminum wire and said epoxy resin, said means comprising setting a wire diameter of said aluminum wire is 0.4±0.05 mmϕ, and setting a coefficient of linear expansion of epoxy resin in a rated temperature range of said module is from 15 to 20 ppm/K, and a coefficient of linear expansion of an epoxy resin at the vicinity of said power semiconductor chip is lower than a coefficient of linear expansion of an epoxy resin from the vicinity of said power semiconductor chip to the sealing surface.

15. The power semiconductor module according to claim 14, wherein the coefficient of linear expansion of said epoxy resin in the rated temperature range of a module is 18 ppm/K±10%.

16. The power semiconductor module according to claim 14, wherein a coating layer comprised of a polyamide resin is provided among said epoxy resin, said power semiconductor chip and a substrate mounted with said power semiconductor chip.

17. The power semiconductor module according to claim 16, wherein thickness of said coating layer is equal to or thinner than 10 μm.

18. The power semiconductor module according to claim 14, wherein said rated temperature range is from 25°-150° C.

19. The power semiconductor module according to claim 14, wherein the first circuit pattern is located on said major surface of said SiN substrate adjacent said chip.

20. The power semiconductor module according to claim 19, wherein a second circuit pattern is located on said major surface of said SiN substrate under said chip such that said second circuit pattern is interposed between said major surface of said SiN substrate and a lower surface of said chip, and wherein said solder is located between said lower surface of said chip and said second circuit pattern to connect the chip to said second circuit pattern.

21. The power semiconductor module according to claim 20, wherein said rated temperature range is from 25°-150° C.

* * * * *